May 30, 1961 E. WOLFENDALE 2,986,650

TRIGGER CIRCUIT COMPRISING TRANSISTORS

Filed Feb. 7, 1956

INVENTOR
ERIC WOLFENDALE
BY [signature]
AGENT

United States Patent Office 2,986,650

Patented May 30, 1961

2,986,650

TRIGGER CIRCUIT COMPRISING TRANSISTORS

Eric Wolfendale, Smallfield, Horley, England, assignor, by mesne assignments, to North American Philips Company, Inc., New York, N.Y., a corporation of Delaware Filed Feb. 7, 1956, Ser. No. 564,067

Claims priority, application Great Britain May 16, 1955

1 Claim. (Cl. 307—88.5)

The present invention relates to transistor trigger circuits. More particularly, the invention relates to a trigger circuit comprising a first junction transistor the emitter and collector of which are connected through two impedances to the terminals of a voltage supply source, a second junction transistor of the same conductivity type supplied from the same source and a feedback loop. It is an object of the invention to provide a very simple trigger circuit of this type and which is relatively insensitive to temperature variations.

In accordance with the invention, the feedback loop of the trigger circuit comprises a first direct current connection by means of which the base of the second transistor is exclusively connected with the collector of the first transistor, and a second connection providing a direct current path between the emitters of the two transistors. The arrangement is such that when the first transistor is conducting, because of the small value of the voltage drop produced between the emitter and collector of the first transistor and of the resistance of the base-emitter input circuit of the second transistor, which input circuit is connected across this voltage drop, the current through said input circuit is maintained at so small a value that the second transistor remains only slightly conductive and the circuit is stable in this state.

Figure 1:
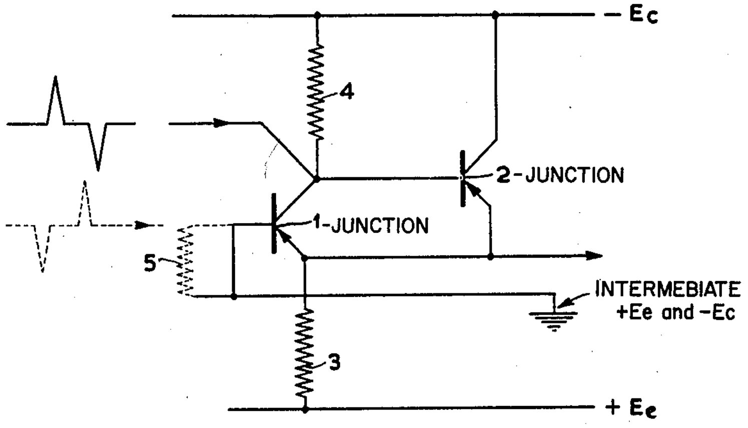

In order that the invention may readily be put into effect, two embodiments thereof will now be described in detail with reference to the accompanying drawing, in which:

Fig. 1 shows the circuit arrangement of a first embodiment, and

Figure 2:
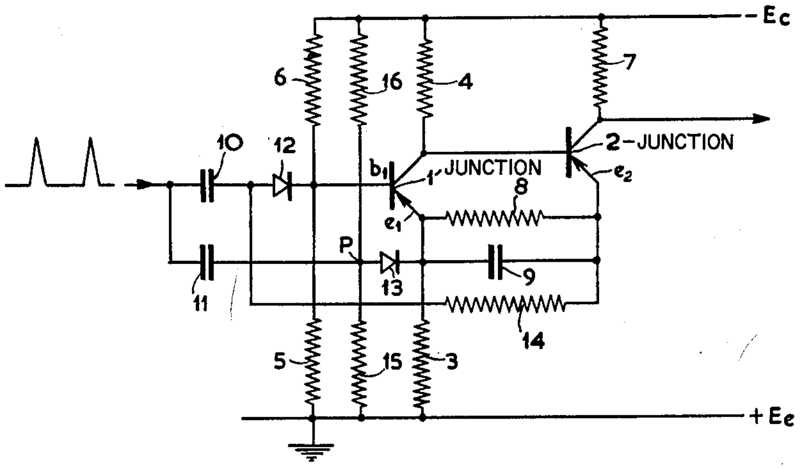

Fig. 2 the circuit arrangement of a second embodiment.

The embodiment shown in Fig. 1 is a bistable trigger circuit. It comprises a first junction transistor 1 of p-n-p conductivity type the emitter and collector of which are connected through two resistances 3 and 4, respectively, to the terminals $+E_e$ and $-E_c$ of a voltage supply source. A second junction transistor 2, which is also of the p-n-p type, is supplied from the same source. A feedback loop comprises a first direct connection by which the base of the second transistor is exclusively connected to the collector of the first transistor and a second direct connection between the emitters of the two transistors. The collector of the transistor 2 is directly connected to the terminal $-E_c$. The terminals $+E_e$ and $-E_c$ are at potentials of, for instance, +3 and −9 volts respectively, with respect to ground and the resistances 3 and 4 have values of, for instance 1 kilohm and 4 kilohms, respectively.

Thus, the transistor 1 acts as a grounded-base amplifier and the transistor 2 is connected as a grounded-collector amplifier. The current gain of the transistor 1 is the ratio between its collector current and emitter current changes and is equal to $\alpha$. In junction transistors the value of $\alpha$ is slightly less than 1 and in grounded-base connection they have a low input impedance and a high output impedance. The current gain of the transistor 2 is the ratio between its collector current and base current changes and is equal to $\alpha'$. In junction transistors the value of $\alpha'$ is much larger than that of $\alpha$ (for instance of the order of 50) and in a grounded-collector circuit they have a correspondingly higher input impedance and a lower output impedance.

Since voltage changes at the input of each transistor cause voltage changes of the same polarity in the respective output circuits, the loop which leads from the collector of the first transistor to the base of the second transistor, through the base-emitter path thereof to the emitter of the first transistor and through the emitter-collector path thereof back to its collector will act as a feedback loop and provide a positive feedback.

It will be assumed first that the transistor 1 is conducting, its collector and emitter currents being substantially determined by the value of the resistor 3 and by the positive voltage $+E_e$. The value of the resistance 4 is so large that in this state the collector potential of the transistor 1 is nearly equal to its emitter potential. Thus, the emitter current of the second transistor is determined by this small potential difference divided by the base-emitter input resistance of the transistor 2. This input resistance is comparatively high so that the current passing through the base-emitter circuit of the second transistor is maintained at so small a value that this transistor remains only slightly conducting and the circuit arrangement is stable in this state.

Assuming now that the second transistor 2 is conducting, its emitter current is determined substantially by the value of the resistor 3 and the potential of its base which is identical to the collector potential of the transistor 1. Since the collector circuit of this transistor includes a comparatively high resistance, whereas the collector of the transistor 2 is directly connected to the terminal $-E_c$, the emitter current of transistor 2 is greater than the emitter current of the transistor 1 in the state first described. This difference in current causes the emitter of the transistor 1 to be negative with respect to its base so that this transistor is cut off. The circuit arrangement may also have the said two stable conditions, when a load resistance is connected in the collector circuit of the transistor 2, provided that this resistance is smaller than the resistance 4 and the difference between the two collector currents is such that the emitter of the transistor 1 is positive with respect to its base in a first condition and is negative with respect thereto in a second condition.

When the transistor 1 is conducting, the circuit arrangement may be changed over to its other condition by a negative-going pulse applied to any point of the feedback loop or by a positive-going pulse applied to the base of the transistor 1. When controlling the trigger circuit by means of pulses applied to the base of the transistor 1, this base is connected to ground through a resistance 5 (shown in broken lines) which may have a value of, for instance, 1 kilohm.

When the transistor 1 is cut off, the circuit arrangement can be changed over to its other condition by a positive going pulse applied to a point of the feedback loop or by a negative-going pulse applied to the base of the transistor 1.

In the embodiment shown in Fig. 2, the positive terminal $+E_e$ of the voltage supply source is connected to ground. The fixed potential of the base of the transistor 1 is determined by means of a voltage divider comprising the input resistance 5 of, for instance, 1 kilohm and a resistance 6 of, for instance, 3 kilohms which is connected to the negative terminal $-E_c$ of the supply source. An output load resistance 7 of, for instance, 1 kilohm is included in the collector circuit of the transistor 2 and a resistance 8, likewise of 1 kilohm, is connected between the emitters of the two transistors. This resistance acts to increase the base-emitter input resistance of the transistor 2 and may be bridged by a capacitor 9 which accelerates the action of the feedback loop.

The circuit arrangement of Fig. 2 is provided with a control device for changing it over from one condition to the other by means of successive pulses of like polarity. The control device comprises two blocking capacitors 10 and 11 which are connected to the input terminal and two diodes 12 and 13 respectively connected in series with the capacitors. The common point of the capacitor 10 and of the diode 12 is connected to the emitter of the transistor 2 through a resistance 14. The common point of the capacitor 11 and of the diode 13 is connected to a tapping point on a voltage divider. This voltage divider comprises resistances 15 and 16 of such values that the potential of the said tapping point is less than that of the emitter of the transistor 1 in the absence of an input pulse. The cathodes of the diodes 12 and 13 are connected to the base and the emitter respectively of the transistor 1. The resistances 14, 15 and 16 act to polarise the diodes 12 and 13 respectively, and to discharge the capacitors 10 and 11, respectively. Their values and the time constants of the circuits 10—14 and 11—15, 16 depend on the maximum frequency at which the circuit arrangement is to be operated.

The control pulses are of such polarity that they increase the potential difference between the base or the emitter of the transistor 1 and the collector of the transistor 2. Since the transistors are of the p-n-p type and their collectors are connected to the negative terminal of the voltage supply source, use is made of positive-going control pulses.

The operation of the control device can most readily be appreciated by considering the potential of four chosen points of the circuit arangement. These points are: the base $b_1$ and the emitter $e_1$ of the transistor 1, the emitter $e_2$ of the transistor 2 and the tapping point P on the voltage divider 15, 16. If it is assumed that the values of the resistances 3, 4 and 5 are the same as in the circuit arrangement shown in Fig. 1, that the terminal $-E_c$ has a potential of −12 volts with respect to the terminal $+E_e$ and to ground and that the value of the resistance 15 is ⅔ of that of the resistance 16, the values of the potentials at the said points are as follows:

| Potential at | $b_1$ | $e_1$ | $e_2$ | P |
|---|---|---|---|---|
| transistor 1 conducting........volts.. | −3 | −2.4 | −2.5 | −4.8 |
| transistor 2 conducting........do.... | −3 | −4 | −8 | −4.8 |

When the transistor 1 is conducting, the diode 13 is cut off by a bias voltage of −4.8+2.4=−2.4 volts, that is, it has a threshold, whereas the diode 12 is cut off by a bias voltage of −3+2.5=−0.5 volt only. Consequently, a pulse applied to the base $b_1$ has an amplitude which is larger by, for instance 1.9 volts than that of the corresponding pulse applied to the emitter $e_1$, so that this pulse changes over the circuits arrangement to the condition in which the transistor 2 is conducting.

When the transistor 2 is conducting, the diode 13 is cut off by a bias voltage of −0.8 volt, while the diode 12 is cut off by a bias voltage of −8+3=−5 volts. Provided that the amplitude of the succeeding pulse remains below this threshold of 5 volts, the transistor 1 is consequently restored to its conducting condition by this pulse.

If the p-n-p transistors of the circuit arrangement described are replaced by n-p-n transistors, the polarities of the terminals $E_c$ and $E_e$ and of the control pulses must obviously be interchanged.

What is claimed is:

A trigger circuit arangement comprising first and second junction type transistors of the same conductivity type each having emitter, collector and base electrodes, a source of supply voltage for said first and second transistors, said sourch of supply voltage having a first terminal and a second teminal, a first direct current carrying impedance connected between the emitter electrode of said first transistor and said first terminal, a second direct current carrying impedance connected between the colllector electrode of said first transistor and said second terminal, a load impedance connected between the collector electrode of said second transistor and said second terminal, a regenerative feedback loop comprising a first direct current connection between the collector electrode of said first transistor and the base electrode of said second transistor, a second direct current connection between the emitter electrode of said second transistor and the junction of the emitter electrode of said first transistor and said first impedance and a series connected resistance interposed in said second direct current connection, a first capacitor connected in parallel with said series connected resistance between the emitter electrode of said second transistor and the said junction, and switching means comprising second and third capacitors, first and second diodes, means for biasing said first and second diodes and input means for switching pulses of the same polarity, said second capacitor being connected in series circuit arrangement with said first diode between said input means and the base electrode of said first transistor and said third capacitor being connected in series circuit arrangement with said second diode between said input means and the junction of the emitter electrode of said first transistor and said first capacitor.

References Cited in the file of this patent

UNITED STATES PATENTS

| | | |
|---|---|---|
| 2,605,306 | Eberhard | July 29, 1952 |
| 2,651,728 | Wood | Sept. 8, 1953 |
| 2,652,460 | Wallace | Sept. 15, 1953 |
| 2,693,568 | Chase | Nov. 2, 1954 |
| 2,710,913 | Sherertz | June 14, 1955 |
| 2,776,420 | Woll | Jan. 1, 1957 |
| 2,825,821 | Logue | Mar. 4, 1958 |
| 2,848,658 | Mitchell | Aug. 19, 1958 |